(12) United States Patent
Takasu et al.

(10) Patent No.: US 7,535,240 B2
(45) Date of Patent: May 19, 2009

(54) SEMICONDUCTOR DEVICE

(75) Inventors: Hiroaki Takasu, Chiba (JP); Sukehiro Yamamoto, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 11/818,123

(22) Filed: Jun. 13, 2007

(65) Prior Publication Data

US 2008/0001146 A1    Jan. 3, 2008

(30) Foreign Application Priority Data

Jun. 16, 2006    (JP) .............................. 2006-166879

(51) Int. Cl.
*G01R 31/02* (2006.01)
*G01R 31/26* (2006.01)
*G01R 11/18* (2006.01)

(52) U.S. Cl. ........................ 324/754; 324/757; 324/758; 439/482; 257/48

(58) Field of Classification Search ......... 324/754–765; 257/48; 439/482

See application file for complete search history.

(56) References Cited

U.S. PATENT DOCUMENTS

2006/0017455 A1*    1/2006    Kikuchi et al. ............... 324/765
2007/0170937 A1*    7/2007    Endou et al. ................. 324/754

FOREIGN PATENT DOCUMENTS

JP    6-45419 A    2/1994

* cited by examiner

*Primary Examiner*—Ha Tran T Nguyen
*Assistant Examiner*—Emily Y Chan
(74) *Attorney, Agent, or Firm*—Brinks Hofer Gilson & Lione

(57) ABSTRACT

Provided is a semiconductor device, in which: patterns for detecting displacement at probing are formed of a plurality of minute conductors formed below a protective film; each of the plurality of minute conductors formed below the protective film is electrically insulated and formed to be smaller than a bottom surface of a tip of a probing needle used for carrying out an electrical measurement of IC chips; and the patterns for detecting displacement at probing are provided in a pair for each of the IC chips.

3 Claims, 5 Drawing Sheets

SEMICONDUCTOR DEVICE

This application claims priority under 35 U.S.C. §119 to Japanese Patent Application No. JP2006-166879 filed Jun. 16, 2006, the entire content of which is hereby incorporated by reference.

BACKGROUND OF THE INVENTION

1. Field of the Invention

The present invention relates to detection patterns for detecting displacement of a probe at the time of probing in a semiconductor device having a plurality of IC chips formed of elements such as a transistor and a pad for probing formed on a silicon substrate.

2. Description of the Related Art

Conventionally, a probing test is generally carried out on an ordinary IC for checking electrical characteristics of a complete product.

Further, minimizing intervals between pads used in a probing test enables chip size reduction in an IC having many pads, and is indispensable to reduce IC cost.

In the probing test, which is often carried out with a thin detection needle, effect of displacement of the needle is larger in an IC having many pads for probing since the pad interval is small. Not only horizontal displacement of the needle in probing but also an inappropriate state of the needle in a depth direction (position or depth of entry of the needle) may prevent acquisition of correct electrical characteristics. Accordingly, in the probing test, detection of the displacement of the probing needle at the testing site is desirable in order to determine whether the test is carried out appropriately or not. A Japanese patent application JP 6-45419 A, for example, discloses a technique in which pads for detecting displacement of a needle at a time of probing is provided to carry out a measurement.

As described in the above, however, effect of displacement of the needle is larger in an IC having many pads for probing since the pad interval is small, resulting in the problems of inaccurate probing test, and capture of erroneous characteristics, and the like. In order to solve these problems, for example, a technique has been disclosed where a plurality of special pads for detecting displacement of a needle in operation are provided while carrying out measurement. However, such technique has problems of the large occupation area for pads, inability in detecting the direction of the displacement, inability in acquiring information along the depth direction, and the like.

SUMMARY OF THE INVENTION

In order to solve the above-mentioned problems, according to an aspect of the present invention, a semiconductor device is structured as follows.

That is, there is provided a semiconductor device in which patterns for detecting displacement at probing are formed of a plurality of minute conductors formed below a protective film. Further, in the semiconductor device, each of the plurality of minute conductors formed below the protective film is electrically insulated and formed to be smaller than a bottom surface of a tip of a probing needle used for carrying out an electrical measurement of the IC chips. In addition, in the semiconductor device, the patterns for detecting displacement at probing are provided in a pair for each of the IC chips.

With the construction described above, a semiconductor device having patterns for detecting displacement at probing which occupy a small area, which can detect not only an amount of transverse displacement but also a direction of the displacement, and which can obtain information in a depth direction can be obtained.

DETAILED DESCRIPTION OF THE PREFERRED EMBODIMENTS

Figure 1:
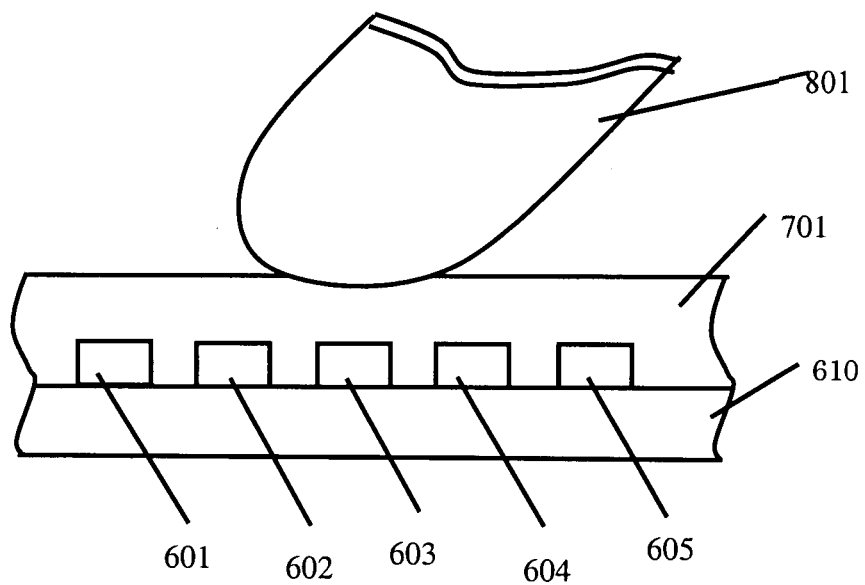
FIG. 1 is a schematic sectional view illustrating a moment in which appropriate probing is carried out in a first embodiment of patterns for detecting displacement at probing according to the present invention.

FIG. 1 is a schematic sectional view of the first embodiment of a semiconductor device according to the present invention showing an instant when an appropriate probing is carried out by using detecting patterns for displacement at probing.

Dot patterns 601 to 605 for detecting capacitance, which are made of minute conductors such as aluminum, are formed on an underlying insulating film 610 made of a silicon oxide film or the like. The respective dot patterns 601 to 605 are electrically insulated and are independent of each other. A protective film 701 formed of an insulating film such as a silicon nitride film is formed on the dot patterns 601 to 605.

For the sake of simplicity, FIG. 1 shows a partial sectional view illustrating only five dot patterns of the plurality of dot patterns for detecting capacitance which are two-dimensionally arranged.

When a probing is carried out for an electrical measurement to the IC chip, the patterns for detecting displacement at probing according to the present invention are simultaneously probed with needles as illustrated in FIG. 1.

A probe needle 801 is in contact with the protective film 701. The probe needle 801 is overdriven into (forced into) the protective film 701 in a depth direction to an appropriate extent for carrying out an electrical measurement of the IC chip.

The dot patterns 601 to 605 for detecting capacitance and the probe needle 801 form capacitors through the protective film 701. The capacitance values of the dot patterns 601 to 605 for detecting capacitance vary depending on their distance from the probe needle 801. In order to precisely detect a change in the capacitance, each of the dot patterns 601 to 605 for detecting capacitance is formed to be smaller than a bottom surface of the probe needle 801.

Figure 4:
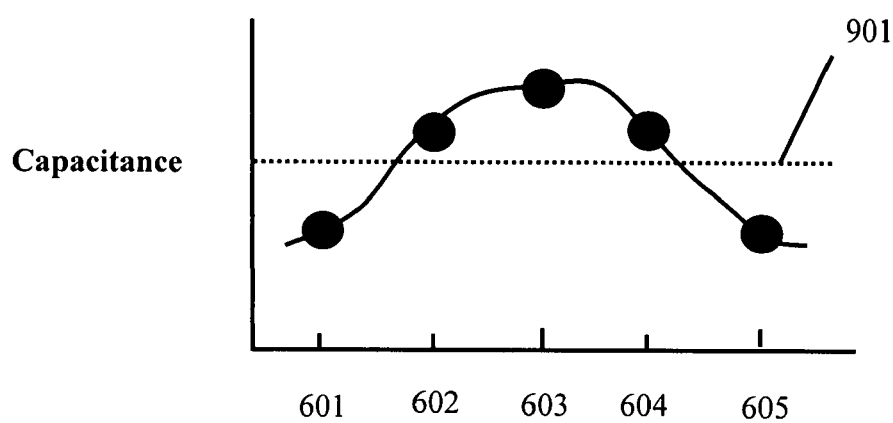
FIG. 4 is a schematic diagram illustrating capacitance between dot patterns 601 to 605 for detecting capacitance and a probe needle 801 in the state illustrated in FIG. 1.

FIG. 4 is a schematic diagram illustrating the capacitance between the dot patterns 601 to 605 for detecting capacitance and the probe needle 801 in the state illustrated in FIG. 1.

As illustrated in FIG. 4, the capacitance values have a maximum at the dot pattern 603 positioned at the center and decrease on both sides as they go further. Measurement of the capacitance for appropriate probing in advance permits the setting of a capacitance clearance line 901.

In the example illustrated in FIG. 4, the capacitance values gradually decrease toward the dot pattern 601 for detecting capacitance and toward the dot pattern 605 for detecting capacitance with the dot pattern 603 being the center.

The capacitance values of the dot patterns 602, 603, and 604 for detecting capacitance are above the predetermined clearance line 901.

As described above, in FIG. 4, the shape taken by the capacitance values, which gradually decrease toward the dot pattern 601 for detecting capacitance and toward the dot pattern 605 for detecting capacitance with the dot pattern 603 being the center, shows that no transverse displacement of the needle is detected. Further, it can be understood that the probing in the depth direction is also appropriate because the capacitance values of the dot patterns 602, 603, and 604 for detecting capacitance are above the predetermined clearance line 901. In this way, characteristics which reflect the appropriate probing as illustrated in FIG. 1 can be detected.

Figure 2:
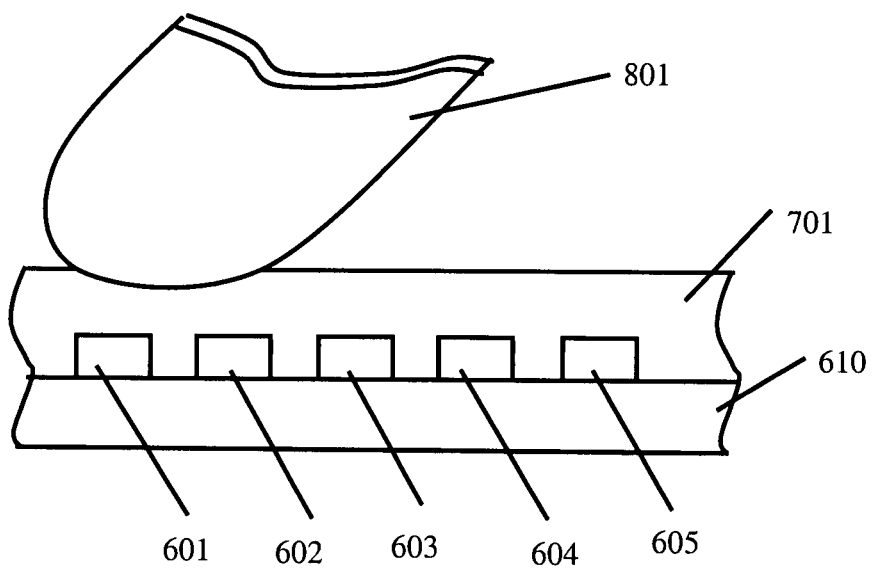
FIG. 2 is a schematic sectional view illustrating a moment in which a probe is transversely displaced in the first embodiment of the patterns for detecting displacement at probing according to the present invention.

FIG. 2 is a schematic sectional view illustrating a probing in which the probe is transversely displaced in the first embodiment of the semiconductor device according to the present invention.

The dot patterns 601 to 605 for detecting capacitance, which are formed of minute conductors, are formed on the underlying insulating film 610. The respective dot patterns 601 to 605 for detecting capacitance are electrically insulated and are in isolation from each other. The protective film 701 is formed on the dot patterns 601 to 605.

For the sake of simplicity, FIG. 2 shows a partial sectional view illustrating only five dot patterns of the plurality of dot patterns for detecting capacitance which are two-dimensionally arranged.

When a probing is carried out for an electrical measurement to the IC chip, the patterns for detecting displacement at probing according to the present invention are simultaneously probed with needles as illustrated in FIG. 2.

The probe needle 801 is in contact with the protective film 701. The probe needle 801 is overdriven into (forced into) the protective film 701 in the depth direction to an appropriate extent for carrying out an electrical measurement of the IC chip.

The dot patterns 601 to 605 for detecting capacitance and the probe needle 801 form capacitors through the protective film 701. The capacitance values of the dot patterns 601 to 605 for detecting capacitance vary depending on their distance from the probe needle 801. In order to precisely detect a change in the capacitance, each of the dot patterns 601 to 605 for detecting capacitance is formed to be smaller than the bottom surface of the probe needle 801.

FIG. 2 illustrates a moment in which the probe needle 801 is transversely displaced toward the dot pattern 601 for detecting capacitance.

Figure 5:
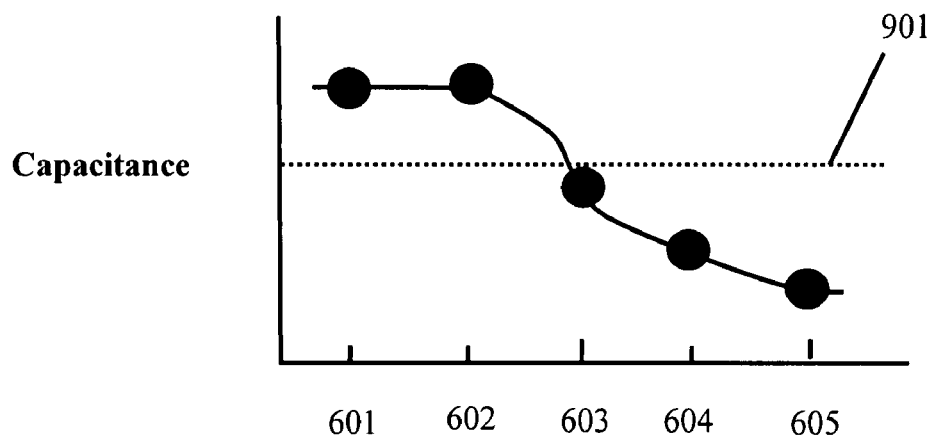
FIG. 5 is a schematic diagram illustrating the capacitance between the dot patterns 601 to 605 for detecting capacitance and the probe needle 801 in the state illustrated in FIG. 2.

FIG. 5 is a schematic diagram illustrating the capacitance between the dot patterns 601 to 605 for detecting capacitance and the probe needle 801 at the moment illustrated in FIG. 2.

In the example illustrated in FIG. 5, the capacitance values gradually decrease from the dot pattern 601 for detecting capacitance, which is positioned at the end of the patterns for detecting displacement, toward the dot pattern 605 for detecting capacitance. It is to be noted that the capacitance values of the dot patterns 601 and 602 for detecting capacitance are above the predetermined clear line 901.

Consequently, it can be detected that even though the needle is transversely displaced, the probing in the depth direction is appropriate. In this way, characteristics which reflect the state of probing in which the probe needle 801 is transversely displaced as illustrated in FIG. 2 can be detected. Other descriptions than that made above are similar to that made with reference to FIG. 1, and thus, no further description is made here.

Figure 3:
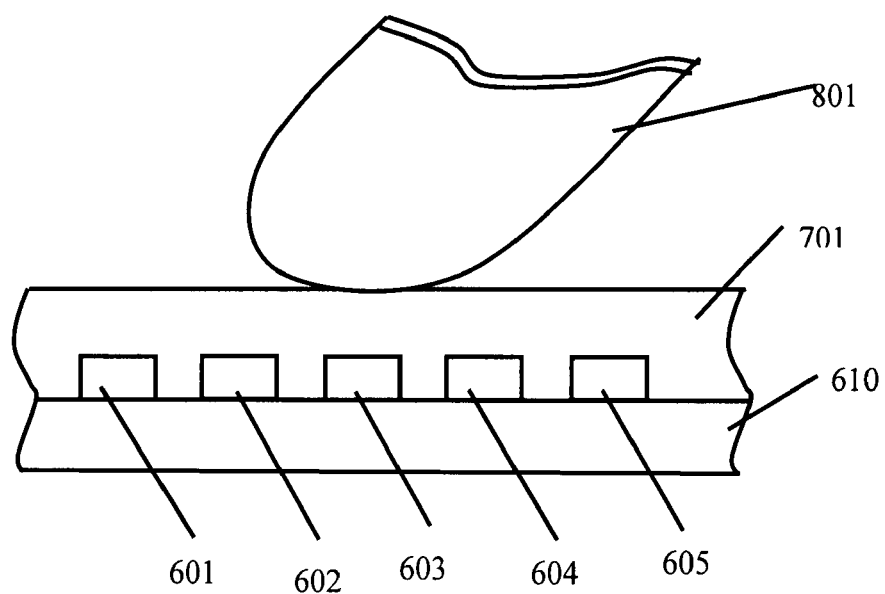
FIG. 3 is a schematic sectional view illustrating a moment in which an amount of overdrive (pushdown) to the probe is insufficient in the first embodiment of the patterns for detecting displacement at probing according to the present invention.

FIG. 3 is a schematic sectional view illustrating a state where the amount of overdrive (pushdown) of the probe is insufficient in the first embodiment of the semiconductor device according to the present invention.

The dot patterns 601 to 605 for detecting capacitance, which are formed of minute conductors, are formed on the underlying insulating film 610. The respective dot patterns 601 to 605 for detecting capacitance are electrically insulated and are in isolation from each other. The protective film 701 is formed on the dot patterns 601 to 605 for detecting capacitance.

For the sake of simplicity, FIG. 3 shows a partial sectional view illustrating only five dot patterns of the plurality of dot patterns for detecting capacitance which are two-dimensionally arranged.

When a probing is carried out for an electrical measurement to the IC chip, the patterns for detecting displacement at probing according to the present invention are simultaneously probed with needles as illustrated in FIG. 3.

The probe needle 801 is in contact with the protective film 701. The probe needle 801 is overdriven into (forced into) the protective film 701 in the depth direction in order to carry out an electrical measurement of the IC chip.

The dot patterns 601 to 605 for detecting capacitance and the probe needle 801 form capacitors through the protective film 701. The capacitance values of the dot patterns 601 to 605 for detecting capacitance vary depending on their distance from the probe needle 801. In order to precisely detect a change in the capacitance, the dot patterns 601 to 605 for detecting capacitance are formed to be smaller than the bottom surface of the probe needle 801.

FIG. 3 illustrates a moment in which, as compared with the examples of FIGS. 1 and 2, the amount of overdrive of the probe needle 801 is insufficient compared with the appropriate amount but the probe needle 801 is not transversely displaced.

Figure 6:
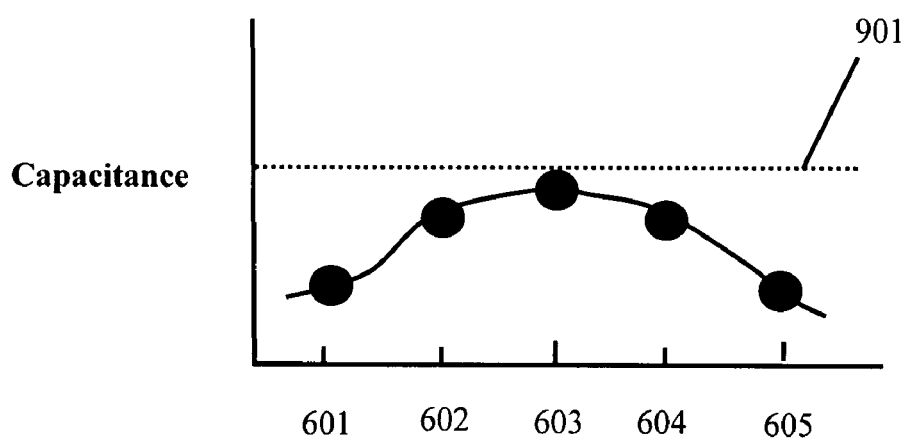
FIG. 6 is a schematic diagram illustrating the capacitance between the dot patterns 601 to 605 for detecting capacitance and the probe needle 801 in the state illustrated in FIG. 3.

FIG. 6 is a schematic diagram illustrating the capacitance between the dot patterns 601 to 605 for detecting capacitance and the probe needle 801 at the moment illustrated in FIG. 3.

In the example FIG. 6, the capacitance values decrease toward the dot pattern 601 for detecting capacitance and toward the dot pattern 605 for detecting capacitance with the dot pattern 603 which is positioned at the center of the pattern being the center. However, the capacitance value of the dot pattern 603 for detecting capacitance of the maximum value is below the predetermined clearance line 901. Accordingly, it can be detected that, even though the needle is not transversely displaced, the amount of overdrive in the depth direction is insufficient.

In this way, characteristics which reflect the state of probing in which the amount of overdrive of the probe needle 801 is insufficient compared with the appropriate amount as illustrated in FIG. 3 can be detected. Other descriptions than that made above are similar to that made with reference to FIG. 1, and thus, no further description is made here.

Figure 7:
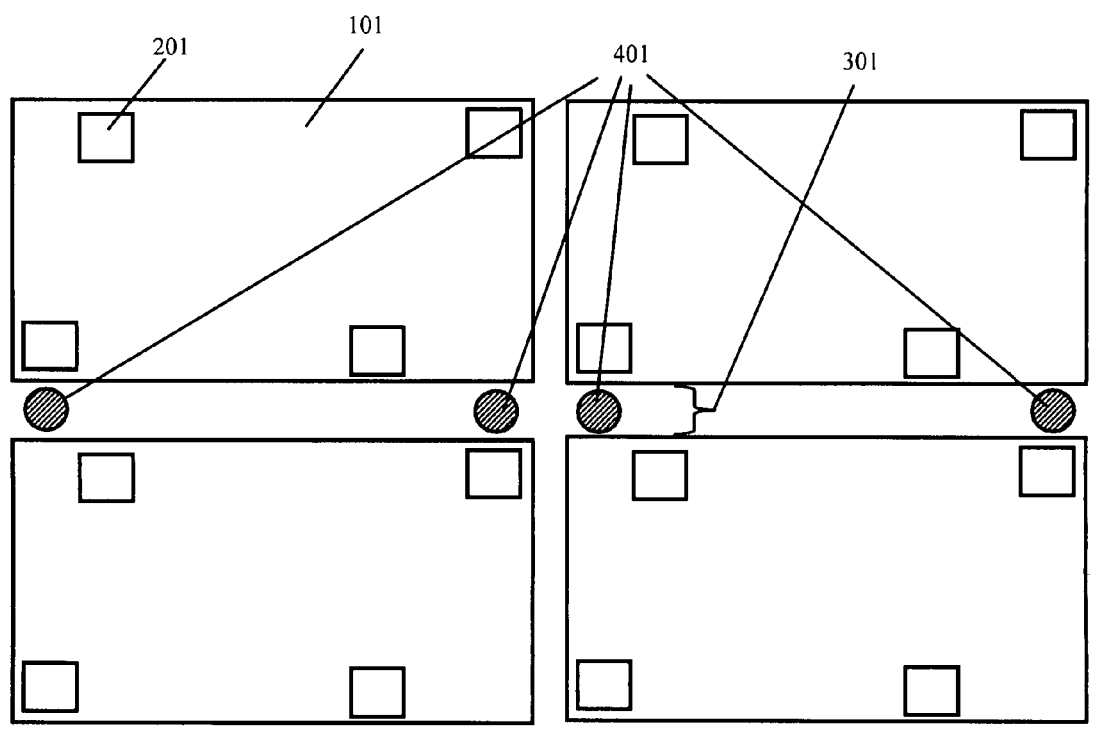
FIG. 7 is a schematic plan view illustrating an arrangement of patterns for detecting displacement at probing in a second embodiment of the present invention.

FIG. 7 is a schematic plan view illustrating a second embodiment of the semiconductor device according to the present invention. Illustrated is an embodiment of an arrangement of the patterns for detecting displacement at probing.

A plurality of IC chips 101 having a plurality of pad regions 201 and a scribe region 301, which is a margin used in cutting an IC, provided between the plurality of IC chips 101 are formed. Patterns 401 for detecting displacement at probing are formed in the scribe region 301.

In the example of FIG. 7, the patterns 401 for detecting displacement at probing are provided in a pair distant from each other for each IC chip 101.

The patterns 401 for detecting displacement at probing are formed in a pair for the purpose of detecting displacement in a theta direction (displacement in a rotational direction of a semiconductor wafer) at the time of probing. In order to improve sensitivity, it is preferable that the pair of patterns 401 for detecting displacement at probing be arranged to be distant from each other as much as possible. Although, in the example of FIG. 7, the patterns 401 for detecting displacement at probing are arranged in a pair for each IC chip 101, when a large number of IC chips 101 are simultaneously probed, by providing the patterns 401 for detecting displacement at probing in a pair for the whole plurality of IC chips 101 to be simultaneously probed, the area occupied by the patterns 401 for detecting displacement at probing can be further reduced, which is preferable.

Figure 8:
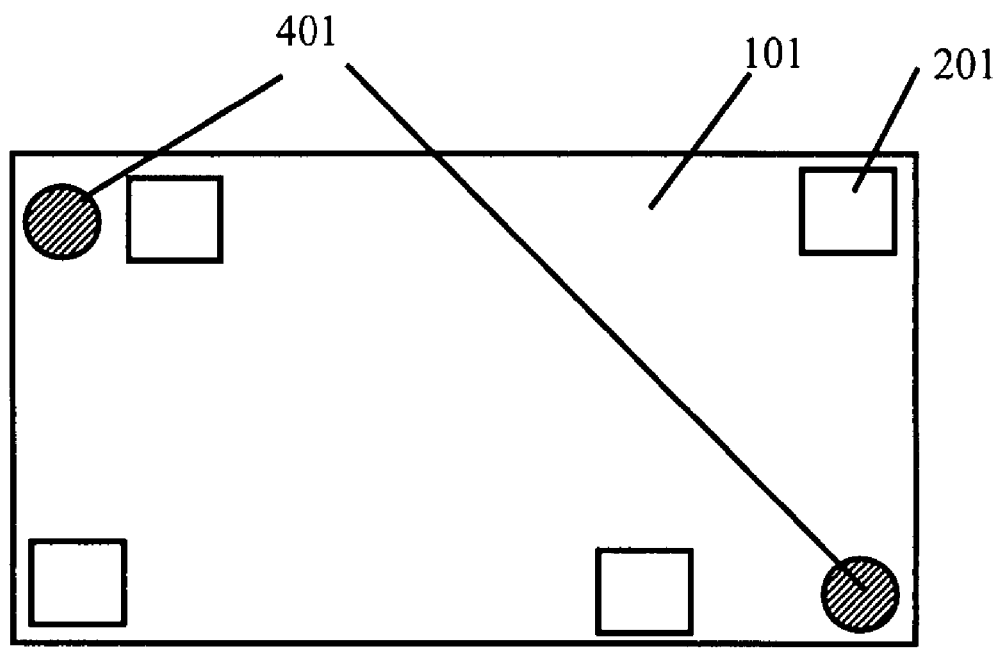
FIG. 8 is a schematic plan view illustrating an arrangement of patterns for detecting displacement at probing in a third embodiment of the present invention.

FIG. 8 is a schematic plan view illustrating a third embodiment of the semiconductor device according to the present invention. Illustrated is another embodiment of the arrangement of the patterns for detecting displacement at probing.

The third embodiment differs from the embodiment illustrated in FIG. 7 in that, while the embodiment illustrated in FIG. 7 has the patterns 401 for detecting displacement at probing in the scribe region 301, the patterns 401 for detecting displacement at probing are arranged in the IC chip 101.

For the sake of preventing the increase in the area of the IC chips 101 due to the area occupied by the patterns 401 for detecting displacement at probing, it is preferable to form the patterns 401 in the scribe region 301 as illustrated in FIG. 7. The patterns 401 may, however, be formed in the IC chips 101 when there is a margin both in the area of the IC chips 101 and in the manufacturing cost. Other descriptions than that made above are similar to that made with reference to FIG. 7, and thus, like numerals are used to designate like or identical members illustrated in FIG. 7 and description thereof is omitted.

What is claimed is:

1. A semiconductor device, comprising:
   a silicon substrate;
   a plurality of IC chips each including a transistor and a pad region for probing, and disposed on the silicon substrate;
   scribe regions adjacent to the plurality of IC chips; and
   patterns for use in detecting displacement at a time of the probing provided in one of the scribe regions and the plurality of IC chips, the patterns comprising a plurality of minute conductors covered by a protective film to electrically isolate the plurality of minute conductors,
   wherein each of the plurality of minute conductors is electrically insulated from one another and is smaller than a tip of a probing needle used to carry out the probing of the plurality of IC chips.

2. A semiconductor device according to claim 1, wherein the patterns are provided in pairs respectively for each of the plurality of IC chips.

3. A semiconductor device according to claim 1, wherein the patterns are provided in pairs respectively for each of groups of IC chips to be simultaneously probed in one probing process.

* * * * *